(12) United States Patent
Oda et al.

(10) Patent No.: US 9,828,694 B2
(45) Date of Patent: Nov. 28, 2017

(54) METHOD OF FORMING METAL FILM

(71) Applicant: FLOSFIA INC., Kyoto-shi, Kyoto (JP)

(72) Inventors: Masaya Oda, Kyoto (JP); Toshimi Hitora, Kyoto (JP)

(73) Assignee: FLOSFIA INC., Kyoto-shi (JP)

( * ) Notice: Subject to any disclaimer, the term of this patent is extended or adjusted under 35 U.S.C. 154(b) by 0 days.

(21) Appl. No.: 14/838,126

(22) Filed: Aug. 27, 2015

(65) Prior Publication Data
US 2016/0060788 A1  Mar. 3, 2016

(30) Foreign Application Priority Data

Aug. 29, 2014 (JP) ................................. 2014-176648
May 27, 2015 (JP) ................................. 2015-108025

(51) Int. Cl.
*H01L 21/288* (2006.01)
*H01L 29/45* (2006.01)
*C30B 19/00* (2006.01)
*C23C 16/18* (2006.01)
*C23C 16/448* (2006.01)
(Continued)

(52) U.S. Cl.
CPC ............. *C30B 19/00* (2013.01); *C03C 17/10* (2013.01); *C23C 16/18* (2013.01); *C23C 16/4486* (2013.01); *C30B 29/02* (2013.01); *H01L 21/288* (2013.01); *H01L 29/45* (2013.01); *C03C 2217/253* (2013.01); *C03C 2218/112* (2013.01)

(58) Field of Classification Search
CPC ........ C23C 16/18; H01L 21/288; H01L 29/45
USPC .......................................... 257/269; 438/680
See application file for complete search history.

(56) References Cited

U.S. PATENT DOCUMENTS 5,034,372 A * 7/1991 Matsuno ............... C23C 16/408
                                                         427/120
2001/0008111 A1* 7/2001 Vaartstra ................. C23C 16/40
                                                         106/287.18
(Continued)

FOREIGN PATENT DOCUMENTS

CN       101903959 A      12/2010
CN       101983259 A       3/2011
(Continued)

OTHER PUBLICATIONS

Extended European Search Report dated Nov. 19, 2015, issued in corresponding European Application No. 15182652.6, 11 pages.
(Continued)

*Primary Examiner* — Moazzam Hossain
*Assistant Examiner* — Omar Mojaddedi
(74) *Attorney, Agent, or Firm* — Christensen O'Connor Johnson Kindness PLLC; Llewellyn Lawson; Juan Zheng (57) ABSTRACT

Provided is a metal film forming method which can form a metal film having excellent adhesion industrially advantageously and a metal film formed by using the method. A method of forming a metal film on a base includes an atomization step of atomizing a raw-material solution into a mist, in which the raw-material is prepared by dissolving or dispersing a metal in an organic solvent containing an oxidant, a chelating agent, or a protonic acid; a carrier-gas supply step of supplying a carrier gas to the mist; a mist supply step of supplying the mist onto the base using the carrier gas; and a metal-film formation step of forming the metal film on part or all of a surface of the base to causing the mist to thermally react.

18 Claims, 8 Drawing Sheets

(51) Int. Cl.
*C03C 17/10* (2006.01)
*C30B 29/02* (2006.01)

(56) References Cited

U.S. PATENT DOCUMENTS

| | | | | |
|---|---|---|---|---|
| 2001/0039919 | A1* | 11/2001 | Hunt | B22F 9/28 |
| | | | | 118/300 |
| 2003/0040181 | A1 | 2/2003 | Suzuki | |
| 2008/0292810 | A1* | 11/2008 | Anderson | B05B 7/045 |
| | | | | 427/565 |
| 2009/0032612 | A1* | 2/2009 | Kunstmann | B05B 17/0607 |
| | | | | 239/102.2 |
| 2009/0169727 | A1 | 7/2009 | Fukasawa | |
| 2012/0125659 | A1 | 5/2012 | Nakako et al. | |
| 2013/0039843 | A1* | 2/2013 | Shirahata | C23C 16/407 |
| | | | | 423/592.1 |
| 2015/0004326 | A1* | 1/2015 | Oladeji | H01M 10/0562 |
| | | | | 427/475 |
| 2015/0194479 | A1 | 7/2015 | Kaneko | |

FOREIGN PATENT DOCUMENTS

| | | |
|---|---|---|
| EP | 1 448 725 A2 | 8/2004 |
| EP | 2 752 869 A1 | 7/2014 |
| EP | 2 915 784 A1 | 9/2015 |
| JP | 2001-168141 A | 6/2001 |
| JP | 2004277585 A | 10/2004 |
| JP | 2007046155 A | 2/2007 |
| JP | 2011-153329 A | 8/2011 |
| JP | 2013-129887 A | 7/2013 |
| WO | 03/032084 A2 | 4/2003 |
| WO | 2014/058290 A1 | 4/2014 |

OTHER PUBLICATIONS

Taiwanese Office Action dated May 10, 2016, issued in corresponding Taiwan Patent Application No. 104128055, filed Aug. 27, 2015, 12 pages.

Korean Notification of Reason for Refusal dated Nov. 28, 2016, issued in corresponding Korean Patent Application No. 10-2015-0121117, filed Aug. 27, 2015, 12 pages.

First Chinese Office Action dated Jun. 19, 2017, for Chinese Application No. 201510540239.2, 23 pages.

\* cited by examiner

METHOD OF FORMING METAL FILM

TECHNICAL FIELD

The present invention relates to a metal film forming method which is useful, for example, in forming an electrode in a semiconductor device.

BACKGROUND ART

Vapor deposition methods or sputtering methods have been used as methods of forming a metal film. Among vapor deposition methods, vacuum evaporation methods and the like are often used in which an electron beam or high frequency is used. Among sputtering methods, for example, a technique is often used in which plasma is generated by direct-current power supply or alternating-current power supply, and then sputtering a metal serving as the anode using the plasma to deposit the metal on the cathode. However, vapor deposition methods and sputtering methods require a vacuum process, so that they have a problem of cost and have a difficulty in upsizing or mass production.

Coating methods and the like are also well known as methods of forming a metal film. Among coating methods, for example, a technique is used in which a metal paste is applied and after drying it is fired. However, such coating methods require a high temperature of 650° C. or more for firing and therefore are not necessarily satisfactory as methods of forming a metal film. Chemical vapor deposition methods and the like are also known as methods of forming a metal film. However, such methods require a high-temperature process, as with the coating methods, and do not necessarily provide sufficient adhesion as well.

On the other hand, in recent years, there have been attempts to form a patterned metal film on a substrate using a paste in which ultrafine particles are dispersed. Examples of such known methods include a method of forming an ultrafine particle electrode, in which a metal paste is prepared by dispersing composite metal ultrafine particles composed of metal cores and organic coating layers in a solvent, and then applying the metal paste onto the electrode of a semiconductor device, and firing the metal paste at low temperature, disclosed in Japanese Unexamined Patent Application Publication No. 2001-168141. However, a metal thin film using ultrafine particles of a precious metal such as Ag or Au does not easily react with a smooth inorganic oxide substrate and therefore sufficient adhesion cannot be obtained. In particular, when a metal plating film is formed on a thin metal wire to increase conductivity, the metal wire is peeled off from the inorganic oxide substrate due to pre-plating treatment or chemical treatment using a plating bath.

In recent years, methods of forming a metal film by aerosol deposition have been also investigated. Japanese Unexamined Patent Application Publication No. 2011-153329 discloses a method of forming a metal thin film serving as an electrode or wiring pattern on a substrate by aerosolizing metal particles and spraying the aerosolized metal particles on the substrate. Japanese Unexamined Patent Application Publication No. 2013-129887 discloses a method of forming a metal thin film serving as an auxiliary electrode on a transparent electrode by an aerosol deposition method. However, aerosol deposition methods make an adhesion between an electrode and a substrate very poor, and they are not suitable especially for forming a thick film serving as an electrode. Further, aerosol deposition methods are not satisfactory because they require a vacuum process during the formation of the film or require high-temperature heat treatment after forming a film.

SUMMARY OF INVENTION

An object of the present invention is to provide a metal film forming method which can form a metal film having excellent adhesion industrially advantageously and a metal film formed by using the method.

To accomplish the above object, the present inventors have intensively investigated. As a result, the present inventors found that when a metal film was formed using an organic solvent containing an oxidant, an amine compound, or a protonic acid through mist CVD, a metal film having excellent adhesion could be formed easily, unlike when a metal oxide film was formed.

After obtaining the above finding, the present inventors conducted further examination and then completed the present invention.

The present invention is as follows.

[1] A method of forming a metal film on a base includes an atomization step of atomizing a raw-material solution into a mist, in which the raw-material solution is prepared by dissolving or dispersing a metal in an organic solvent containing an oxidant, an amine compound, or a protonic acid, a carrier-gas supply step of supplying a carrier gas to the mist, a mist supply step of supplying the mist onto the base using the carrier gas, and a metal-film formation step of forming the metal film on part or all of a surface of the base by causing the mist to thermally react.

[2] The method of the above [1], wherein the organic solvent contains the oxidant.

[3] The method of the above [2], wherein a volume ratio between the oxidant and the organic solvent ranges from 1:99 to 50:50.

[4] The method of the above [2] or [3], wherein the oxidant is water or hydrogen peroxide.

[5] The method of the above [1], wherein the organic solvent contains the amine compound.

[6] The method of the above [5], wherein the amine compound is diamine.

[7] The method of the above [1], wherein the organic solvent contains the protonic acid.

[8] The method of the above [7], wherein the protonic acid is a halide acid.

[9] The method of any one of the above [1] to [8], wherein the thermal reaction is carried out at a temperature of 200° C. to 650° C.

[10] The method of any one of the above [1] to [9], wherein the thermal reaction is carried out in an atmosphere of an inert gas or a reducing gas.

[11] The method of any one of [1] to [10], wherein the metal is one or more kinds selected from gold (Au), silver (Ag), platinum (Pt), copper (Cu), iron (Fe), manganese (Mn), nickel (Ni), palladium (Pd), cobalt (Co), rhodium (Rh), ruthenium(Ru), chromium (Cr), molybdenum (Mo), tungsten (W), and aluminum (Al).

[12] The method of any one of the above [1] to [11], wherein the organic solvent is an alcohol.

[13] The method of any one of the above [1] to [12], wherein the raw-material solution is a mixed solution of the organic solvent containing the oxidant, the amine compound, or the protonic acid and a metal complex solution containing the metal or a metal salt solution containing the metal.

[14] A metal film formed using the method of any one of the above [1] to [13].

[15] The metal film of the above [14], wherein the metal film is an electrode.

[16] A semiconductor device including the metal film of the above [15] as an electrode, further including at least a semiconductor layer.

[17] A precursor solution of a mist for forming a metal film, wherein the precursor solution is prepared by dissolving or dispersing a metal in an organic solvent containing an oxidant, an amine compound, or a protonic acid.

[18] The precursor solution of the above [17], wherein the organic solvent contains the oxidant.

[19] The precursor solution of the above [18], wherein a volume ratio between the oxidant and the organic solvent ranges from 1:99 to 50:50.

[20] The precursor solution of the above [17], wherein the organic solvent contains the amine compound or the protonic acid.

According to the metal film forming method of the present invention, a metal film having excellent adhesion can be formed industrially advantageously. Further, the metal film of the present invention has excellent adhesion.

DESCRIPTION OF EMBODIMENTS

A metal film forming method of the present invention is a method of forming a metal film on a base and includes an atomization step of atomizing, into a mist, a raw-material solution prepared by dissolving or dispersing a metal in an organic solvent containing an oxidant, an amine compound, or a protonic acid, a carrier-gas supply step of supplying a carrier gas to the mist, a mist supply step of supplying the mist onto the base using the carrier gas, and a metal-film formation step of forming the metal film on part or all of a surface of the base by causing the mist to thermally react.

In the atomization step, a raw-material solution is prepared by dissolving or dispersing a metal in an organic solvent containing an oxidant, an amine compound, or a protonic acid, and the raw-material solution is then atomized into a mist.

The organic solvent containing an oxidant used in the present step (hereafter also referred to as the "oxidant-containing organic solvent") is not particularly limited as long as the organic solvent contains an oxidant. For example, it is obtained by mixing a known organic solvent and an oxidant. The volume ratio between the oxidant and organic solvent ranges preferably from 1:99 to 50:50, more preferably from 1:99 to 40:60, even more preferably from 1:99 to 10:90, most preferably from 1:99 to 5:95. Use of such preferable volume ratios makes the mist more suitable for forming a film, as well as makes the film quality better.

Examples of the oxidant include water and known water-soluble and water-insoluble oxidants. In the present invention, the oxidant is preferably water or water-soluble oxidant, more preferably water or hydrogen peroxide, most preferably water. If a water-soluble oxidant is used, it is preferably used in the form of an aqueous solution (e.g., a hydrogen peroxide solution) by mixing water with it.

More specific examples of the oxidant include water, peroxides such as hydrogen peroxide ($H_2O_2$), sodium peroxide ($Na_2O_2$), barium peroxide ($BaO_2$), and benzoyl peroxide($C_6H_5CO)_2O_2$ and organic peroxides such as hypochlorous acid (HClO), perchloric acid, nitric acid, peracetic acid, and nitrobenzene.

More specific examples of the water include pure water, extra-pure water, tap water, well water, mineral water, mine water, hot spring water, spring water, fresh water, and seawater. Examples of the water also include water obtained by subjecting these types of water to purification, heating, sterilization, filtration, ionic exchange, electrolysis, osmotic pressure adjustment, buffering, or the like (e.g., ozone water, purified water, hot water, deionized water, physiological saline, phosphate-buffered solution, phosphate buffered saline).

The type of the organic solvent is not particularly limited as long as the objects of the present invention are not impaired. Examples of the organic solvent include alcohols (e.g., methanol, ethanol, propanol, isopropanol, butanol, tert-butanol), ethers (e.g., dioxane, tetrahydrofuran, diethyl ether, tert-butyl methyl ether, diisopropyl ether, ethylene glycol-dimethyl ether), esters (e.g., ethyl formate, ethyl acetate, n-butyl acetate), carboxylic acids (e.g., formic acid, acetic acid, propionic acid), halogenated hydrocarbons (e.g., dichloromethane, chloroform, carbon tetrachloride, trichloroethylene, 1,2-dichloroethane, chlorobenzene), hydrocarbons (e.g., n-hexane, benzene, toluene), amides (e.g., formamide, N,N-dimethylformamide, N,N-dimethylacetamide), ketones (e.g., acetone, methyl ethyl ketone, methyl isobutyl ketone), nitriles (e.g., acetonitrile, propionitrile), sulfolane, hexamethylphosphoramide, and mixtures thereof. In the present invention, the organic solvent is preferably an alcohol, a ketone, or a mixture thereof, more preferably an alcohol, most preferably a lower alcohol (preferably a C1-C3 alcohol).

The type of the organic solvent containing an amine compound used in the present step (hereafter also referred to as the "amine compound-containing organic solvent") is not particularly limited as long as the organic solvent contains an amine compound. For example, it is obtained by mixing a known organic solvent and an amine compound. The concentration of the amine compound in the organic solvent ranges preferably from 0.001 mol/L to 10 mol/L, more preferably from 0.005 mol/L to 1 mol/L, most preferably from 0.01 mol/L to 0.1 mol/L. Use of such preferable concentrations makes the mist more suitable for forming a film, as well as makes the film quality better.

The type of the amine compound is not particularly limited as long as the objects of the present invention are not impaired. For example, it may be a compound including oxygen, sulfur, nitrogen, or the like. Examples of the amine compound include C1-C16 aliphatic compounds, including methylamine, ethylamine, propylamine, isopropylamine, n-butylamine, isobutylamine, sec-butylamine, t-butylamine, hexylamine, 2-methoxyethylamine, 2-ethoxyethylamine, 3-methoxypropylamine, 3-methylthiopropylamine, ethylenediamine, propylenediamine, butylenediamine, hexamethylenediamine, diethylenetriamine, triethylenetetramine, tetraethylenepentamine, iminobispropylamine, methyliminobispropylamine, lauryliminobispropylamine, N,N'-bisaminopropyl-1,3-propylenediamine, N,N'-bisaminopropyl-1,3-butylenediamine, 1,2-diaminopropane, bis-(3-aminopropyl)ether, bis-(3-aminopropoxy)ethane, 1,3bis-(3-aminopropoxy)-2,2-dimethylpropane, N-laurylpropylenediamine, N,N'-di-t-butylethylenediamine, N-methylethylenediamine, N-ethylethylenediamine, N,N-dimethylethylenediamine, and allylamine; C1-C16 alicyclic compounds, including cyclopentylamine, cyclohexylamine, cycloheptylamine, cyclooctylamine, aminomethylcyclohexane, 4-methylcyclohexylamine, 1-cyclohexylethylamine, 3,3,5-trimethylcyclohexylamine, isophoronediamine, and bisaminomethylcyclohexane; C1-C16 aromatic compounds, including benzylamine, phenethylamine, 4-methylbenzylamine, N-aminopropylaniline, 2-amino-1,2-diphenylethanol, 9-aminofluorene, benzhydrylamine, xylylenediamine, phenylenediamine, diaminodiphenylmethane, N-dibenzylethylenediamine, 2-aminopyridine, 3-aminopyridine, 4-aminopyridine, 2,3-diaminopyridine, 2,5-diaminopyridine, 2,3,6-triaminopyridine, N-aminopropylaniline, 2-amino-3-methylpyridine, 2-amino-4-methylpyridine, 2-amino-6-methylpyridine, 2-amino-3-ethylpyridine, 2-amino-3-propylpyridine, 2-amino-4,6-dimethylpyridine, 2,6-diamino-4-methylpyridine, 3-amino-6-isopropylpyridine, and 2,6-diaminopyridine; C1-C16 heterocyclic compounds, including piperazine, N-aminopropylpiperazine, 2-methylpiperazine, 2,6-dimethylpiperazine, 2,5-dimethylpiperazine, 3-methylaminopiperidine, 2-aminomethylpiperazine, 3-aminopyrrolidine, homopiperazine, N-aminopropylpiperazine, 1,4-(bisaminopropyl)piperazine, N-aminoethylpiperidine, N-aminopropylpiperidine, 2-aminomethylpiperidine, 4-aminomethylpiperidine, furfurylamine, tetrahydrofurfurylamine, 3-(methylamino)pyrrolidine, 5-methylfurfurylamine, 2-(furfurylthio)ethylamine, 2-picolylamine, 3-picolylamine, and 4-picolylamine; and compounds having one or more hydroxyl groups, including 2-hydroxyethylamine, methyl(2-hydroxyethyl)amine, 1-amino-2-propanol, 3-amino-1-propanol, 2-amino-1-propanol, 1-amino-2-propanol, diethanolamine, 3-amino-1,2-propanediol, 2-(2-aminoethoxy)ethanol, N-(2-hydroxyethyl)ethylenediamine, and 2-amino-1,3-propanediol. In the present invention, the amine compound is preferably polyamine, more preferably diamine. Examples of the polyamine include aliphatic polyamines, including ethylenediamine, diethylenetriamine, triethylenetetramine, tetraethylenepentamine, polyoxypropylenediamine, and polyoxypropylenetriamine; alicyclic polyamines, including isophoronediamine, menthene diamine, bis(4-amino-3-methyldicycldohexyl)methane, diaminodicyclohexylmethane, bis(aminomethyl)cyclohexane, N-aminoethylpiperazine, and 3,9-bis(3-aminopropyl)-2,4,8,10-tetraoxaspiro(5.5)undecane; mononuclear polyamines, including m-phenylenediamine, p-phenylenediamine, tolylene-2,4-diamine, tolylene-2,6-diamine, mesitylene-2,4-diamine, mesitylene-2,6-diamine, 3,5-diethyltolylene-2,4-diamine, and 3,5-diethyltolylene-2,6-diamine; aromatic polyamines, including biphenylenediamine, 4,4-diaminodiphenylmethane, 2,5-naphthylenediamine, and 2,6-naphthylenediamine; and imidazoles, such as 2-aminopropylimidazole.

The type of the organic solvent used in the amine compound-containing organic solvent is not particularly limited as long as the objects of the present invention are not impaired. Examples of the organic solvent include alcohols (e.g., methanol, ethanol, propanol, isopropanol, butanol, tert-butanol), ethers (e.g., dioxane, tetrahydrofuran, diethyl ether, tert-butyl methyl ether, diisopropyl ether, ethylene glycol-dimethyl ether), esters (e.g., ethyl formate, ethyl acetate, n-butyl acetate), carboxylic acids (e.g., formic acid, acetic acid, propionic acid), halogenated hydrocarbons (e.g., dichloromethane, chloroform, carbon tetrachloride, trichloroethylene, 1,2-dichloroethane, chlorobenzene), hydrocarbons (e.g., n-hexane, benzene, toluene), ketones (e.g., acetone, methyl ethyl ketone, methyl isobutyl ketone), and mixtures thereof. In the present invention, the organic solvent is preferably an alcohol, a ketone, or a mixture thereof, more preferably an alcohol, most preferably a lower alcohol (preferably a C1-C3 alcohol).

The type of the organic solvent containing a protonic acid used in the present step (hereafter also referred to as the "protonic acid-containing organic solvent") is not particularly limited as long as the organic solvent contains a protonic acid. For example, it is obtained by mixing a known organic solvent and a protonic acid. The concentration of the protonic acid in the organic solvent ranges preferably from 0.001 mol/L to 10 mol/L, more preferably from 0.005 mol/L to 1 mol/L, most preferably from 0.01 mol/L to 0.1 mol/L. Use of such preferable concentrations makes the mist more suitable for forming a film, as well as makes the film quality better.

The type of the protonic acid is not particularly limited as long as the objects of the present invention are not impaired, and may be a known protonic acid. Examples of the protonic acid include inorganic acids, including hydrochloric acid, sulfuric acid, nitric acid, phosphoric acid, fluoroboric acid, hydrofluoric acid, and perchloric acid, organic carboxylic acids, phenols, and organic sulfonic acids. Examples of the organic carboxylic acids include formic acid, acetic acid, oxalic acid, hydroxybenzoic acid, phthalic acid, maleic acid, fumaric acid, malonic acid, tartaric acid, citric acid, lactic acid, succinic acid, monochloroacetic acid, dichloroacetic acid, trichloroacetic acid, trifluoroacetic acid, nitroacetic acid, and triphenylacetic acid. Examples of the organic sulfonic acids include alkylbenzene sulfonic acid, alkyl naphthalene sulfonic acid, alkyl naphthalene disulfonic acid, naphthalene sulfonic acid formaldehyde polycondensation, melamine sulfonic acid formaldehyde polycondensation, naphthalene disulfonic acid, naphthalenetrisulfonic acid, dinaphthyl methane disulfonic acid, anthraquinone sulphonic acid, anthraquinone disulfonic acid, anthracene sulfonic acid, and pyrenesulfonic acid. Metal salts of these compounds may also be used. In the present invention, the protonic acid is preferably an inorganic acid, more preferably a halide acid. Examples of the halide acid include hydrochloric acid, hydrobromic acid, hydroiodic acid, and hydrofluoric acid.

The type of the organic solvent used in the protonic acid-containing organic solvent is not particularly limited as long as the objects of the present invention are not impaired. Examples of such a solvent include alcohols (e.g., methanol, ethanol, propanol, isopropanol, butanol, tert-butanol), ethers (e.g., dioxane, tetrahydrofuran, diethyl ether, tert-butyl methyl ether, diisopropyl ether, ethylene glycol-dimethyl ether), esters (e.g., ethyl formate, ethyl acetate, n-butyl acetate), ketones (e.g., acetone, methyl ethyl ketone, methyl isobutyl ketone), and mixtures thereof. In the present invention, the organic solvent is preferably an alcohol, a ketone, or a mixture thereof, preferably an alcohol, most preferably a lower alcohol (preferably a C1-C3 alcohol).

The type of the metal used in the present step is not particularly limited as long as the objects of the present invention are not impaired. In the present invention, the metal is preferably one or more kinds selected from gold (Au), silver (Ag), platinum (Pt), copper (Cu), iron (Fe), manganese (Mn), nickel (Ni), palladium (Pd), cobalt (Co), rhodium (Rh), ruthenium(Ru), chromium (Cr), molybdenum (Mo), tungsten (W), and aluminum (Al).

In the present step, a raw-material solution is prepared by dissolving or dispersing the above metal in the above oxidant-containing organic solvent, amine compound-containing organic solvent, or protonic acid-containing organic solvent. The type of the raw-material solution is not particularly limited as long as the above metal is dissolved or dispersed in the above oxidant-containing organic solvent, amine compound-containing organic solvent, or protonic acid-containing organic solvent. In the present invention, the raw-material solution is preferably a mixed solution of an organic solvent containing an oxidant, an amine compound, or a protonic acid and a metal complex solution containing the above metal or a metal salt solution containing the above metal.

The concentration of the metal in the entire raw-material solution is not particularly limited, but is preferably from 0.01 to 70 mass %, more preferably from 0.1 to 50 mass %.

The raw-material solution prepared by dissolving or dispersing the metal in the organic solvent containing an oxidant, an amine compound, or a protonic acid is particularly useful as a precursor solution of a mist for forming a metal film.

In the present step, the raw-material solution is atomized into a mist. The type of atomization means is not particularly limited as long as the atomization means can atomize the raw-material solution, and may be known atomization means. In the present invention, it is preferred to use atomization means using ultrasound.

In the carrier-gas supply step, a carrier gas is supplied to the mist. The type of the carrier gas is not particularly limited as long as the objects of the present invention are not impaired. Preferred examples of the carrier gas include inert gases such as oxygen, nitrogen, and argon and reducing gases such as hydrogen gas and forming gas. While a single carrier gas may be used, two or more carrier gases may also be used. A diluted gas obtained by changing the concentration of the carrier gas (e.g., a 10-fold diluted gas) may be further used as a second carrier gas. Further, the carrier gas may be supplied from two or more locations not only from a single location.

In the mist supply step, the mist is supplied onto a base by the carrier gas. The flow rate of the carrier gas is not particularly limited, but is preferably from 0.01 to 20 L/min, more preferably from 1 to 10 L/min.

The type of the base is not particularly limited as long as it can support a metal film. The material of the base is also not particularly limited as long as the objects of the present invention are not impaired. The material of the base may be any known base or any organic or inorganic compound. The base may be in the shape of any of a plate such as a flat plate or disc, a fiber, a bar, a cylinder, a prism, a tube, a spiral, a sphere, and a ring. In the present invention, the base is preferably a substrate.

The type of the substrate is not particularly limited as long as the substrate serves as a support for a film. While the substrate may be an insulator substrate, a semiconductor substrate, or a conductive substrate, it is preferably an insulator substrate or a substrate having a metal film thereon. In the present invention, the substrate is preferably a substrate containing a corundum-structured crystal as a main component or a substrate containing a β galia-structured crystal as a main component. For the substrate containing a corundum-structured crystal as a main component, the concentration of the corundum-structured crystal in the substrate is not particularly limited as long as it is 50% or more. In the present invention, the concentration is preferably 70% or more, more preferably 90% or more. Examples of the substrate including a corundum-structured crystal as a main component include sapphire substrates (e.g., c-plane sapphire substrates) and α-phase gallium oxide substrates. For the substrate containing a β-galia-structured crystal as a main component, the concentration of the β-galia-structured crystal in the substrate is not particularly limited as long as it is 50% or more. In the present invention, the concentration is preferably 70% or more, more preferably 90% or more. Examples of the substrate containing a β galia-structured crystal as a main component include β-$Ga_2O_3$ substrates and mixed-crystal substrates containing $Ga_2O_3$ and $Al_2O_3$ in which the concentration of $Al_2O_3$ is more than 0 wt % and 60 wt % or less. Other examples of the substrate include substrates having a hexagonal structure (e.g., SiC substrates, ZnO substrates, GaN substrates). If a substrate having a hexagonal structure is used, it is preferred to form a film directly on the substrate or with another layer (e.g., a buffer layer) therebetween. The thickness of the substrate is not particularly limited in the present invention, but is preferably from 50 to 2000 μm, more preferably from 200 to 800 μm.

In the metal-film formation step, the mist is caused to thermally react, so that a metal film is formed on part or all of the surface of the base. The thermal reaction is not particularly limited as long as the mist thermally reacts. The reaction conditions or the like are also not particularly limited as long as the objects of the present invention are not impaired. In the present invention, the thermal reaction is carried out preferably at a temperature of 200° C. to 650° C., more preferably at a temperature of 300° C. to 600° C., most preferably at a temperature of 400° C. to 550° C. Further, the thermal reaction is carried out preferably in a non-oxygen atmosphere, more preferably in an atmosphere of an inert gas such as nitrogen gas or argon gas or a reducing gas such as forming gas or hydrogen gas, most preferably in an atmosphere of an inert gas. While the reaction may be carried out under any of increased pressure, reduced pressure, normal pressure, and atmospheric pressure, it is preferably carried out under normal pressure or atmospheric pressure in the present invention. Note that the film thickness can be set by adjusting the film forming time. In the present invention, excellent adhesion is obtained even when increasing the film thickness and therefore it is preferred to set a long film forming time. The film forming time is preferably 10 min or more, more preferably 30 min or more, most preferably one hour or more.

According to the present invention, a metal film having excellent adhesion can be formed, although it is unknown whether the reason is that crystals can be grown intermittently. Further, according to the present invention, while ensuring excellent adhesion, it is possible to easily form a metal film with a thickness of 200 nm or more (preferably 300 nm or more, more preferably 500 nm or more, even more preferably 1 μm or more, most preferably 10 μm or more). Accordingly, the metal film formed using the metal film forming method of the present invention is useful as an electrode or a contact layer. Such a metal film is also included in the present invention, and the metal film of the present invention can be used as an electrode or a contact layer. Further, an electrode formed of the metal film of the present invention is useful in a semiconductor device and can be used at least with a semiconductor layer.

Examples of the semiconductor layer include an oxide semiconductor layer, a nitride semiconductor layer, and a semiconductor layer containing silicon. The oxide semiconductor layer is preferably a semiconductor layer containing, as a main component, an oxide semiconductor containing one or more elements selected from indium, aluminum, and gallium. The nitride semiconductor layer is preferably a semiconductor layer containing, as a main component, a nitride semiconductor containing one or more elements selected from indium, aluminum, and gallium. The semiconductor containing silicon is preferably a semiconductor layer containing silicon or silicon carbide as a main component.

As with conventional metal films, the metal film of the present invention can be used for various purposes. For example, it can be used as an electrode or a contact layer in various semiconductor devices and, in particular, can be used in power devices. Typically, semiconductor devices are classified into lateral devices, in which an electrode is formed on one side of a semiconductor layer, and vertical devices, in which electrodes are provided on both sides of a semiconductor layer. The metal film of the present invention can be suitably used in both lateral devices and vertical devices. However, it is preferred to use the metal film of the present invention as an electrode in vertical devices.

Examples of the semiconductor devices include Schottky barrier diodes (SBDs), metal semiconductor field-effect transistors (MESFETs), high-electron-mobility transistors (HEMTs), metal oxide semiconductor field-effect transistors (MOSFETs), static induction transistors (SITs), junction field-effect transistors (JFETs), insulated gate bipolar transistors (IGBTs), and light-emitting diodes. The metal film of the present invention is used preferably in SBDs, MOSFETs, SITs, JFETs, or IGBTs, more preferably in SBDs, MOSFETs, or SITs.

The above semiconductor devices may include yet another layer (e.g., an insulator layer, a semi-insulator layer, a conductor layer, a semiconductor layer, a buffer layer, or any other intermediate layers) or the like.

Example 1

Figure 1:
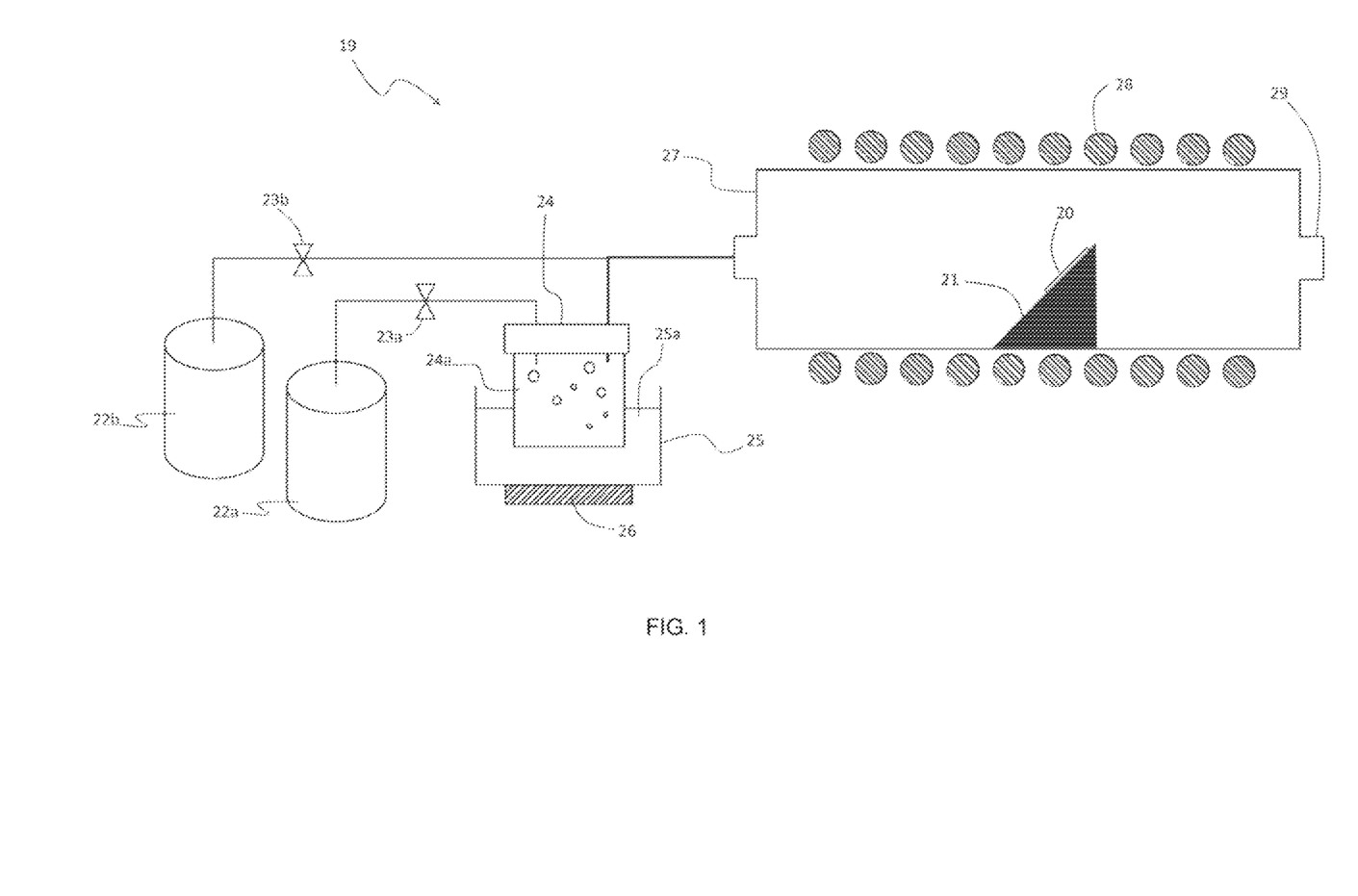
FIG. 1 is a configuration diagram of a mist epitaxy device used in Example 1.

Referring now to FIG. 1, a mist epitaxy device 19 used in the present Example will be described. In FIG. 1, the mist epitaxy device 19 includes a susceptor 21 having a substrate 20 placed thereon, carrier gas supply means 22a for supplying a carrier gas, a flow rate control valve 23a for controlling the flow rate of the carrier gas supplied from the carrier gas supply means 22a, carrier gas (dilution) supply means 22b for supplying a carrier gas (dilution), a flow rate control valve 23b for controlling the flow rate of the carrier gas (dilution) supplied from the dilution carrier gas supply means 22b, a mist source 24 containing a raw-material solution 24a, a container 25 containing water 25a, an ultrasonic transducer 26 mounted on the bottom of the container 25, a supply pipe 27 formed of a 40 mm-inner diameter quartz tube, a heater 28 disposed around the supply pipe 27, and an exhaust port 29 for exhausting a mist, droplets, and exhaust gas after thermal reaction. The susceptor 21 is formed of quartz, and the surface thereof for placing the substrate 20 is inclined from the horizontal plane. By forming both the supply pipe 27 serving as a film forming chamber and susceptor 21 from quartz, entry of device-derived impurities into a film formed on the substrate 20 is reduced.

A solution prepared by dispersing rhodium acetylacetonate (0.01 mol/L) in a mixed solvent of methanol and water (methanol to water ratio=9.5:0.5) was used as a raw-material solution. C-plane sapphire was used as a substrate. Nitrogen was used as a carrier gas. The flow rate of the carrier gas was set to 5 L/min, and the flow rate of the carrier gas (dilution) was set to 0.5 L/min. A metal film was formed at 500° C. in a nitrogen atmosphere.

Figure 2:
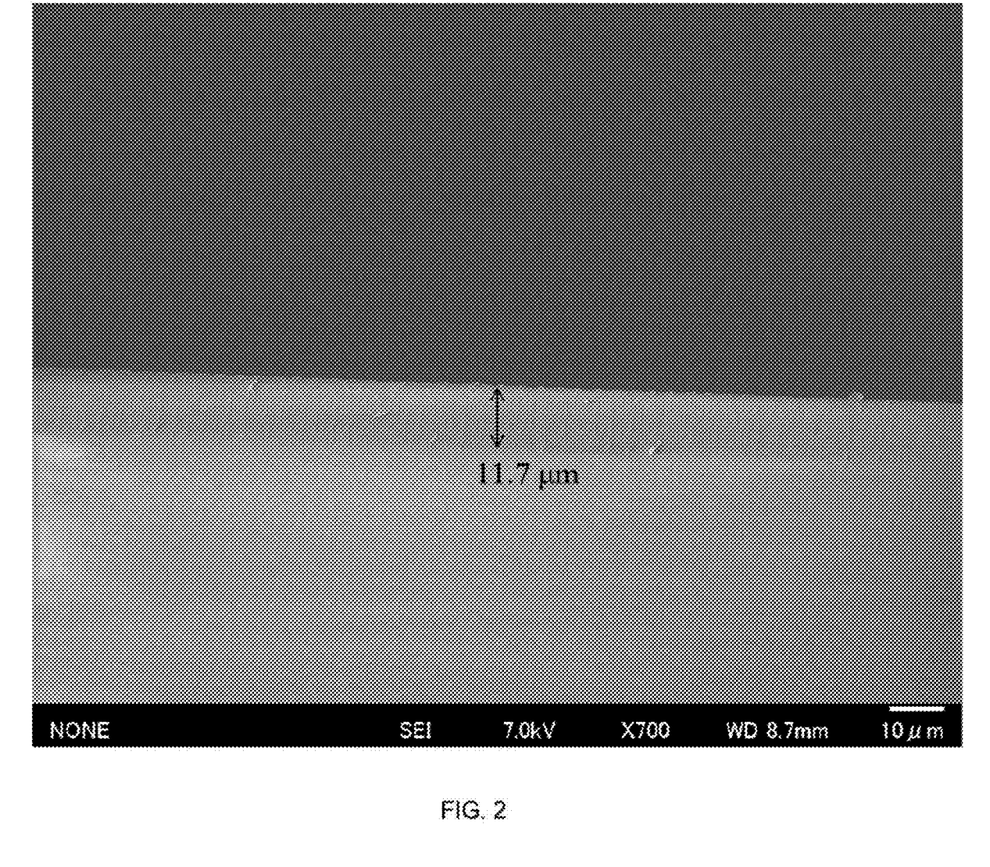
FIG. 2 is a drawing showing a cross-sectional SEM image in Example 1.

By using an X-ray diffraction device, the formed metal film was confirmed to have a rhodium metal film formed therein. The thickness of the rhodium film was measured using a cross-sectional SEM image and found to be about 11.7 μm. The cross-sectional SEM image is shown in FIG. 2.

Figure 3:
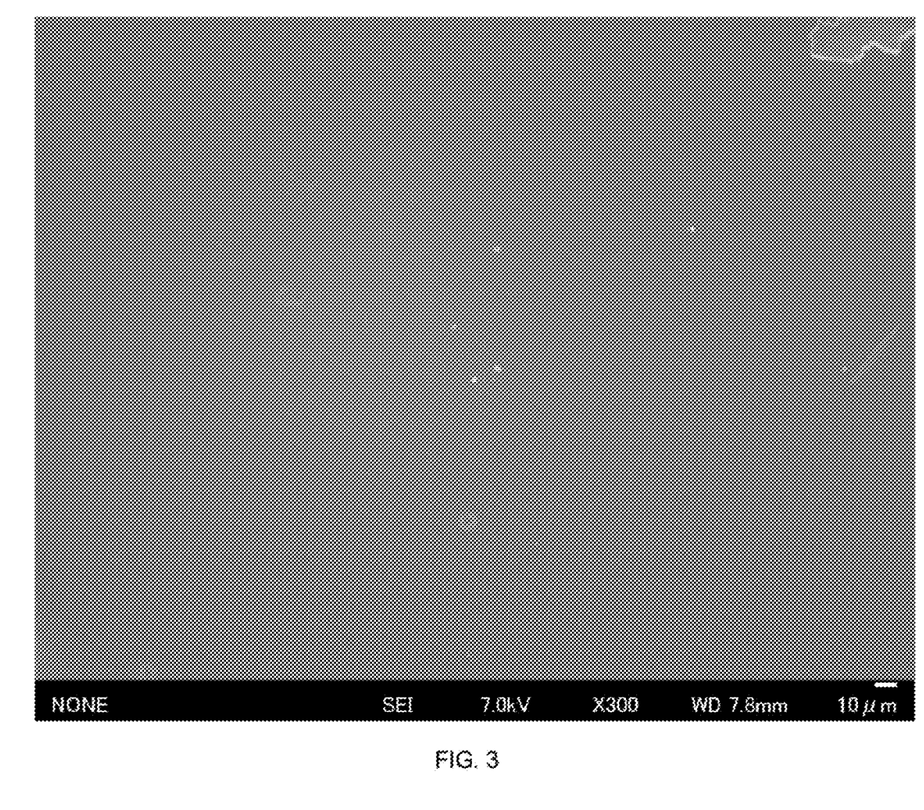
FIG. 3 is a drawing showing a SEM image of a metal film surface in Example 1.

Further, the surface of the metal film was observed using the SEM and found to be a less-bumpy, neat surface. A SEM image of this metal film surface is shown in FIG. 3.

Further, stress was applied to the metal film and then the peel state of the film was observed visually. As a result, the metal film was found not to have been peeled at all, that is, found to have excellent adhesion.

Example 2

Metal films were formed as in Example 1 except that the mixing ratio (volume ratio) between water and methanol was those shown in Table 1. The quality and adhesion of the formed metal films were evaluated. The results are shown in Table 1.

TABLE 1

| Volume ratio | | | |
|---|---|---|---|
| Water | Methanol | Film Formation | Adhesion |
| 0 | 100 | Δ Film quality is not so good | Δ Not so good |
| 1 | 99 | ⊚ Good | ⊚ Good |
| 5 | 95 | ⊚ Good | ⊚ Good |
| 10 | 90 | ○ Fairly good | ⊚ Good |
| 20 | 80 | ○ Fairly good | ○ Fairly good |
| 30 | 70 | ○ Fairly good | ○ Fairly good |
| 40 | 60 | ○ Fairly good | ○ Fairly good |
| 50 | 50 | Δ Colloid occurred (otherwise faily good) | Δ Not so good |
| 100 | 0 | X Difficult to form film due, e.g., to coloring of substrate surface by yellow of raw material | X Difficult to evaluate |

Example 3

A metal film was formed as in Example 1 except that aluminum acetylacetonate was used in place of rhodium acetylacetonate. As a result, it was found that even when aluminum was used, a film could be formed in the same way as rhodium was used.

Example 4

1. Film Forming Device

Figure 4:
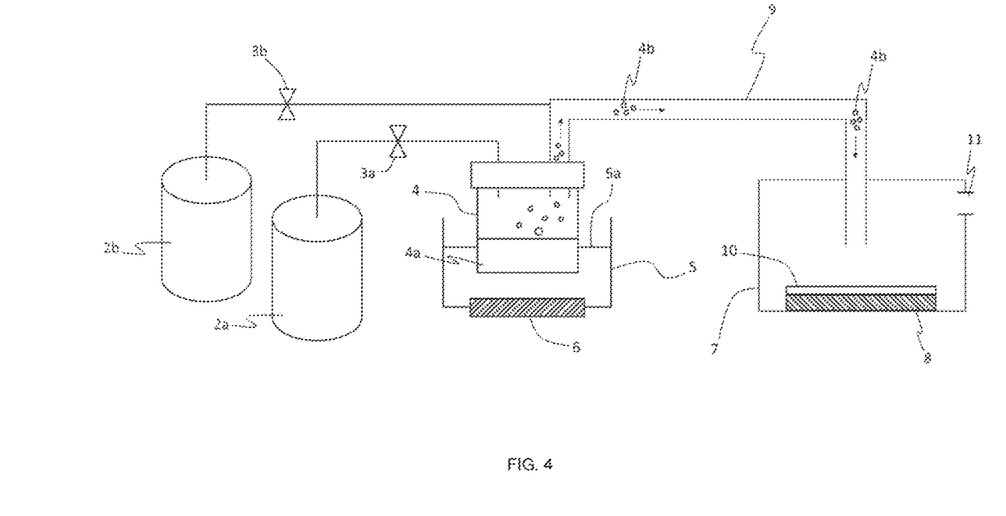
FIG. 4 is a schematic configuration diagram of a mist epitaxy device used in Example 4.

In Example 4, a mist epitaxy device 1 shown in FIG. 4 was used in place of the mist epitaxy device 19 used in Example 1. Referring now to FIG. 4, the mist epitaxy device 1 used in Example 4 will be described. The mist epitaxy device 1 includes a carrier gas source 2a for supplying a carrier gas, a flow rate control valve 3a for controlling the flow rate of the carrier gas supplied from the carrier gas source 2a, carrier gas (dilution) source 2b for supplying a carrier gas (dilution), a flow rate control valve 3b for controlling the flow rate of the carrier gas (dilution) supplied from the carrier gas (dilution) source 2b, a mist source 4 containing a raw-material solution 4a, a container 5 containing water 5a, an ultrasonic vibrator 6 mounted on the bottom of the container 5, a film forming chamber 7, a supply pipe 9 connecting the mist source 4a to the film forming chamber 7, a hot plate 8 mounted in the film forming chamber 7, and an exhaust port 11 for exhausting a mist, droplets, and exhaust gas after thermal reaction. A substrate 10 is placed on the hot plate 8.

2. Preparing Raw-Material Solution

Copper acetylacetonate was mixed into methanol in such a manner that the concentration of copper acetylacetonate became 0.05 mol/L. Further, ethylenediamine was added as a chelating agent in such a manner that the concentration thereof in the mixed solution became 0.5 volume %. Thus, a raw-material solution 4a was prepared.

3. Preparing for Film Formation

The raw-material solution 4a obtained in the above 2. was charged into the mist source 4. Then, a glass substrate serving as the substrate 10 was placed on the hot plate 8, which was then operated to increase the temperature in the film forming chamber 7 to 500° C. Then, the flow rate control valves 3a, 3b were opened to supply carrier gases from the carrier-gas supply means 2a, 2b serving as carrier gas sources into the film forming chamber 7. After sufficiently substituting the carrier gases for the atmosphere in the film forming chamber 7, the flow rates of the carrier gas and the carrier gas (dilution) were adjusted to 5.0 L/min and 0.5 L/min, respectively. Nitrogen was used as the carrier gases.

4. Forming Metal Film

Figure 5:
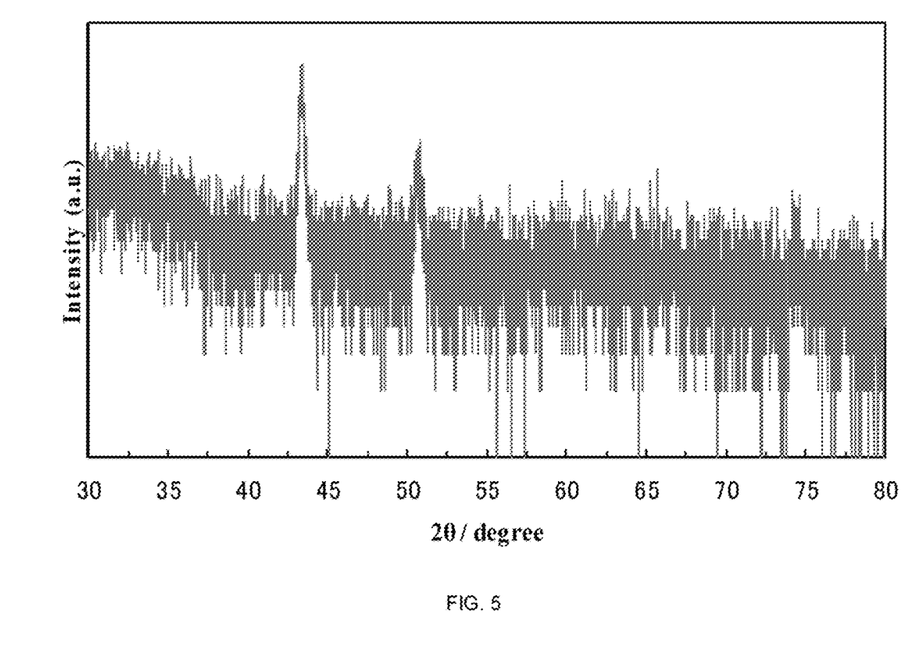
FIG. 5 is a drawing showing XRD measurement results in Example 4.

Subsequently, the ultrasonic transducer 6 was vibrated at 2.4 MHz in such a manner that the vibration propagated through the water 5a into the raw-material solution 4a. Thus, the raw-material solution 4a was atomized into a mist 4b. The mist 4b was introduced into the film forming chamber 7 by the carrier gas through the supply pipe 9. The mist then thermally reacted in the film forming chamber 7 under atmospheric pressure and at 400° C., so that a copper film was formed on the substrate 10. The film formation time was 30 min. The copper film was then checked using an X-ray measuring instrument. The XRD measurement results are shown in FIG. 5. The thickness of the copper film was 200 nm. Further, the adhesion thereof was evaluated as in Example 1 and found to be good.

Example 5

Figure 6:
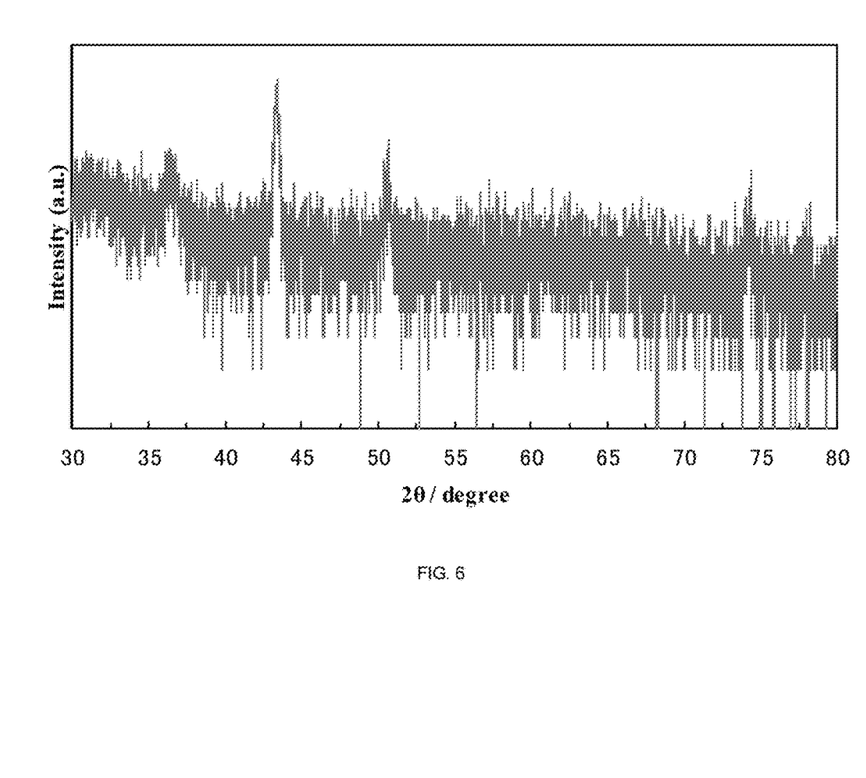
FIG. 6 is a drawing showing XRD measurement results of Example 5.

A copper film was formed as in Example 4 except that the film formation temperature was set to 500° C. in place of 400° C. The copper film was then checked using an X-ray measuring instrument. The XRD measurement results are shown in FIG. 6. The thickness of the copper film was 925 nm. Further, the adhesion thereof was evaluated as in Example 1 and found to be good.

Example 6

Figure 7:
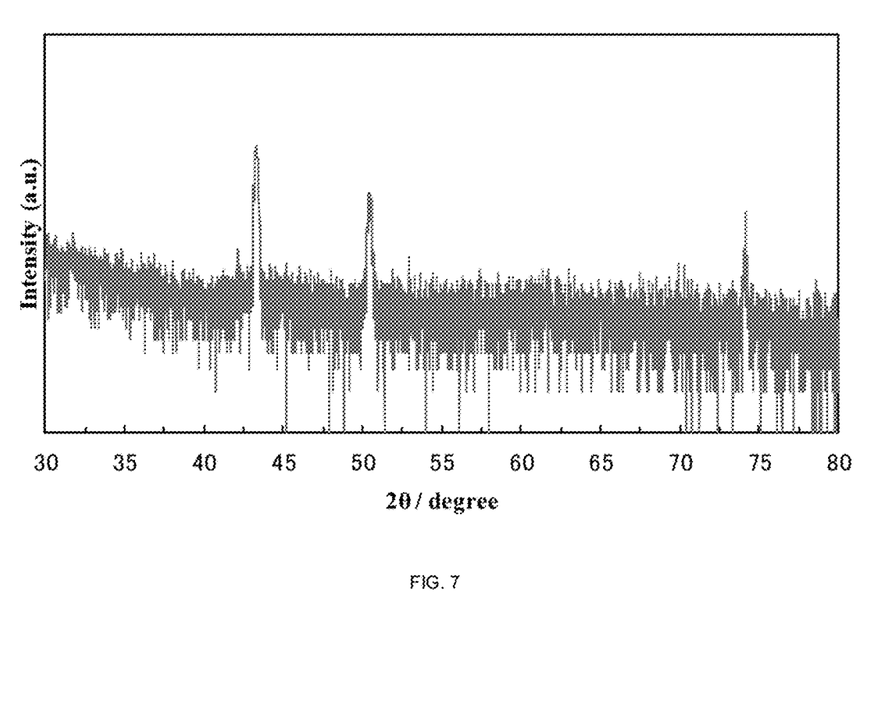
FIG. 7 is a drawing showing XRD measurement results of Example 6.

Copper acetylacetonate was mixed into methanol in such a manner that the concentration of copper acetylacetonate became 0.05 mol/L. Further, hydrochloric acid was added as a protonic acid in such a manner that the concentration thereof in the mixed solution became 0.25 volume %. Thus, a raw-material solution was prepared. A copper film was formed as in Example 4 except that this raw-material solution was used in place of the raw-material solution 4a of Example 4. The copper film was then checked using an X-ray measuring instrument. The XRD measurement results are shown in FIG. 7. The thickness of the copper film was 799 nm. Further, the adhesion thereof was evaluated as in Example 1 and found to be good.

Figure 8:
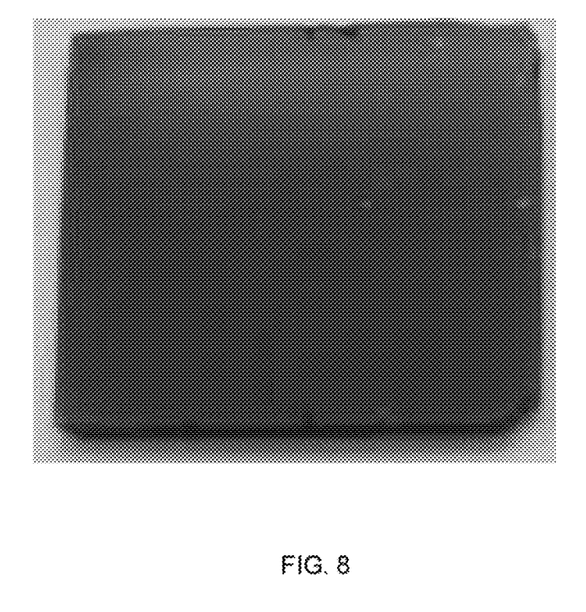
FIG. 8 is a drawing showing a surface image of a metal film in Example 5.

In Examples 4, and 5, in which the chelating agent was used, the metal films had better luster. For reference, a surface image of the copper film formed in Example 5 is shown in FIG. 8. In Example 6, in which the protonic acid was used, the film formation rate was better.

The metal film forming method of the present invention can be used in all fields, including semiconductors (e.g., compound semiconductor electronic devices), electronic components/electric apparatus components, optical/electronic image-related devices, and industrial materials. In particular, this method is useful in manufacturing semiconductor devices, since it can form a good electrode.

While illustrative embodiments have been illustrated and described, it will be appreciated that various changes can be made therein without departing from the spirit and scope of the invention.

The invention claimed is:

1. A method of forming a metal film on a base, comprising:
    an atomization step of atomizing a raw-material solution into a mist, in which the raw-material solution is prepared by dissolving or dispersing a metal in an organic solvent containing an oxidant, an amine compound, or a protonic acid;
    a carrier-gas supply step of supplying a carrier gas to the mist;
    a mist supply step of supplying the mist onto the base using the carrier gas; and
    a metal-film formation step of forming the metal film on part or all of a surface of the base by causing the mist to thermally react, wherein the metal film consists of one or more metals,
    wherein the thermal reaction is carried out under normal pressure or atmospheric pressure,
    the thermal reaction is not carried out in an oxidizing atmosphere, and
    the thermal reaction is not carried out with a plasma.

2. The method of claim 1, wherein the organic solvent contains the oxidant.

3. The method of claim 2, wherein a volume ratio between the oxidant and the organic solvent ranges from 1:99 to 50:50.

4. The method of claim 2, wherein the oxidant is water or hydrogen peroxide.

5. The method of claim 1, wherein the organic solvent contains the amine compound.

6. The method of claim 5, wherein the amine compound is diamine.

7. The method of claim 1, wherein the organic solvent contains the protonic acid.

8. The method of claim 7, wherein the protonic acid is a halide acid.

9. The method of claim 1, wherein the thermal reaction is carried out at a temperature of 200° C. to 650° C.

10. The method of claim 1, wherein the thermal reaction is carried out in an atmosphere of an inert gas or a reducing gas.

11. The method of claim 1, wherein the one or more metals are selected from gold (Au), silver (Ag), platinum (Pt), copper (Cu), iron (Fe), manganese (Mn), nickel (Ni), palladium (Pd), cobalt (Co), rhodium (Rh), ruthenium(Ru), chromium (Cr), molybdenum (Mo), tungsten (W), and aluminum (Al).

12. The method of claim 1, wherein the organic solvent is an alcohol.

13. The method of claim 1, wherein the raw-material solution is a mixed solution of an organic solvent containing the oxidant, the amine compound, or the protonic acid and a metal complex solution containing the metal or a metal salt solution containing the metal.

14. A metal film formed using the method of claim 1.

15. The metal film of claim 14, wherein the metal film is an electrode.

16. A semiconductor device comprising the metal film of claim 15 as an electrode, further comprising at least a semiconductor layer.

17. The method of claim 2, wherein a volume ratio between the oxidant and organic solvent ranges from 1:99 to 40:60.

18. The method of claim 1, the metal film formation step forms the metal film with a thickness of 10 μm or more.

* * * * *